(12) United States Patent
Majhi et al.

(10) Patent No.: US 7,545,003 B2
(45) Date of Patent: Jun. 9, 2009

(54) DEFECT-FREE SOURCE/DRAIN EXTENSIONS FOR MOSFETS HAVING GERMANIUM BASED CHANNEL REGIONS

(75) Inventors: Prashant Majhi, Austin, OR (US); William Tsai, Saratoga, CA (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/864,907

(22) Filed: Sep. 29, 2007

(65) Prior Publication Data

US 2009/0085129 A1    Apr. 2, 2009

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/368; 257/336; 257/E21.06; 257/E27.062

(58) Field of Classification Search ........... 257/334, 257/336, 337, 338, 368, 369, E27.06, E27.062
See application file for complete search history.

(56) References Cited

U.S. PATENT DOCUMENTS 7,119,369 B2 * 10/2006 Wang et al. .................. 257/69

\* cited by examiner

*Primary Examiner*—Hoai V. Pham
(74) *Attorney, Agent, or Firm*—Rahul Engineer

(57) ABSTRACT

A process for forming defect-free source and drain extensions for a MOSFET built on a germanium based channel region deposits a first silicon germanium layer on a semiconductor substrate, deposits a gate dielectric layer on the silicon germanium layer, and deposits a gate electrode layer on the gate dielectric layer. A dry etch chemistry etches those layers to form a gate electrode, a gate dielectric, and a silicon germanium channel region on the semiconductor substrate. Next, an ion implantation process forms halo implant regions that consume portions of the silicon germanium channel region and the semiconductor substrate. Finally, an in-situ doped epitaxial deposition process grows a pair of silicon germanium layers having LDD regions. The silicon germanium layers are adjacent to the silicon germanium channel region and the halo implant regions do not damage any portion of the silicon germanium layers.

6 Claims, 4 Drawing Sheets

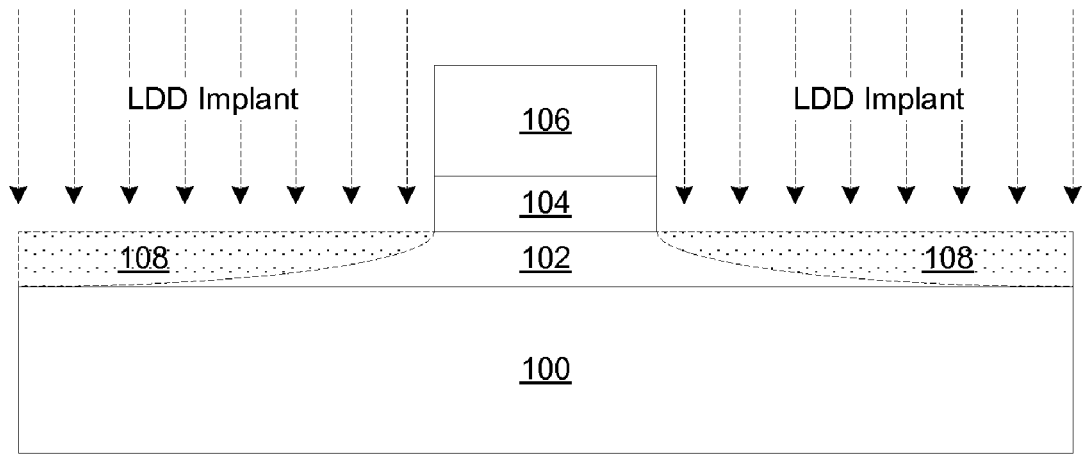
Fig._1 (prior art)
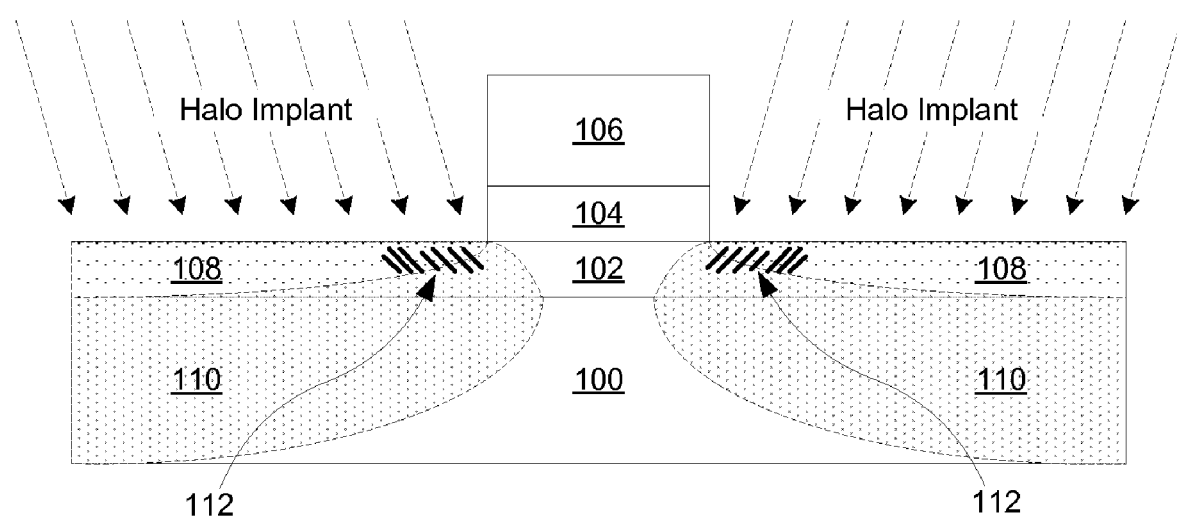
Fig._2 (prior art)

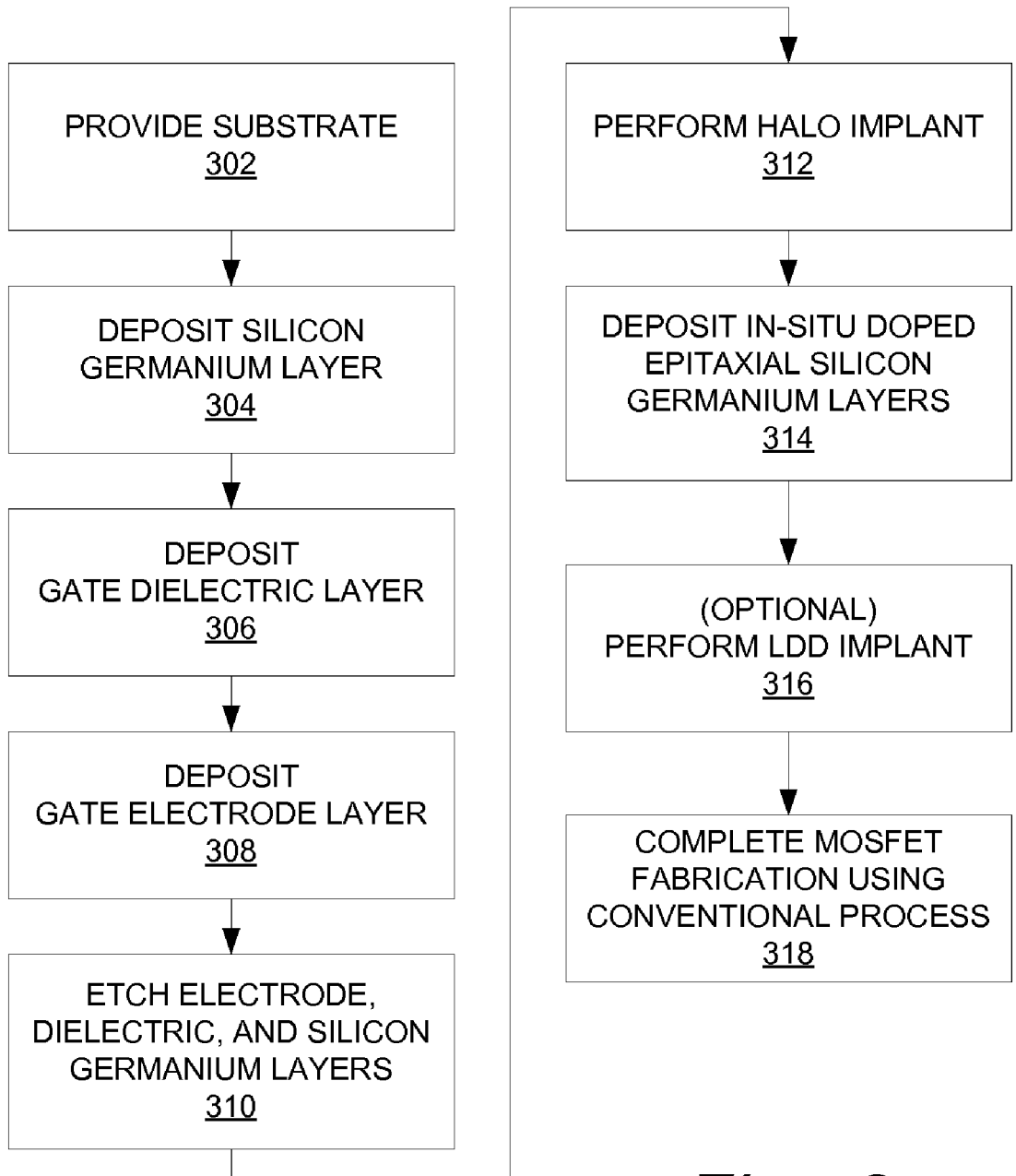
Fig. _3

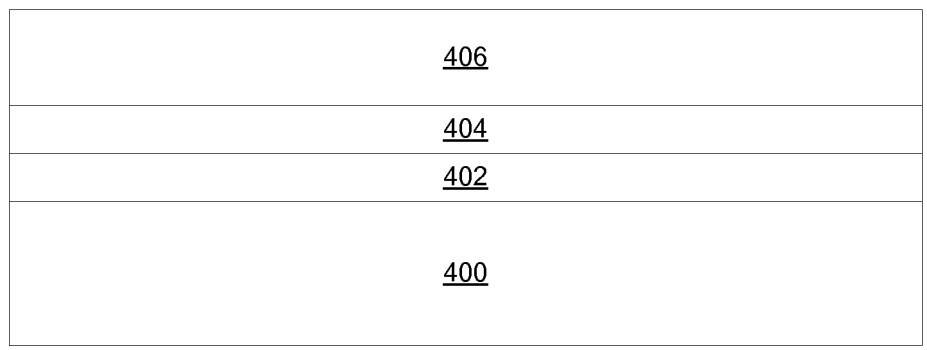
*Fig._4A*
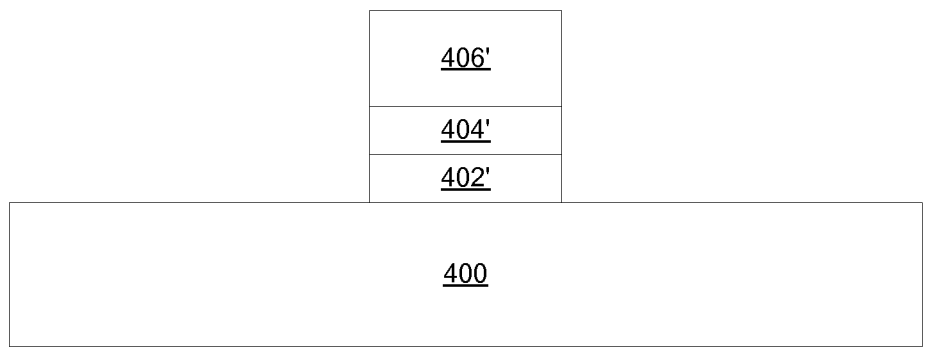
*Fig._4B*
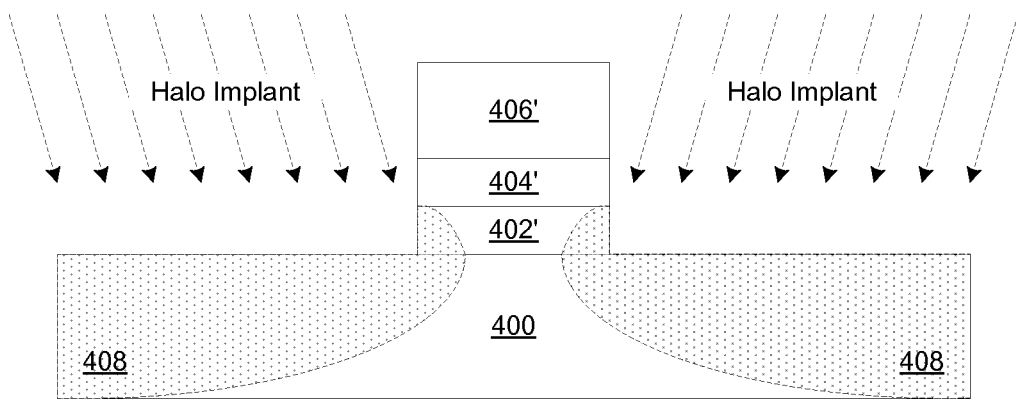
*Fig._4C*

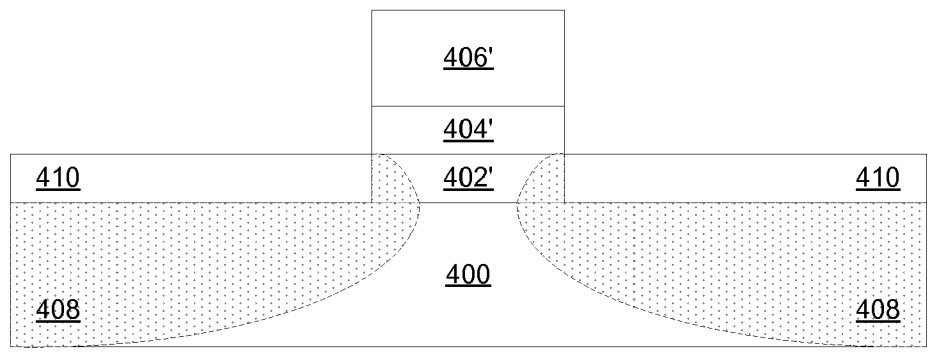
Fig._4D
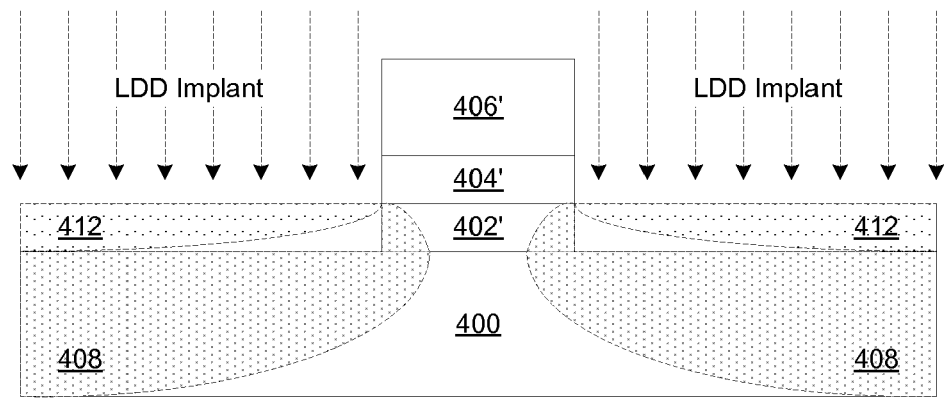
Fig._4E
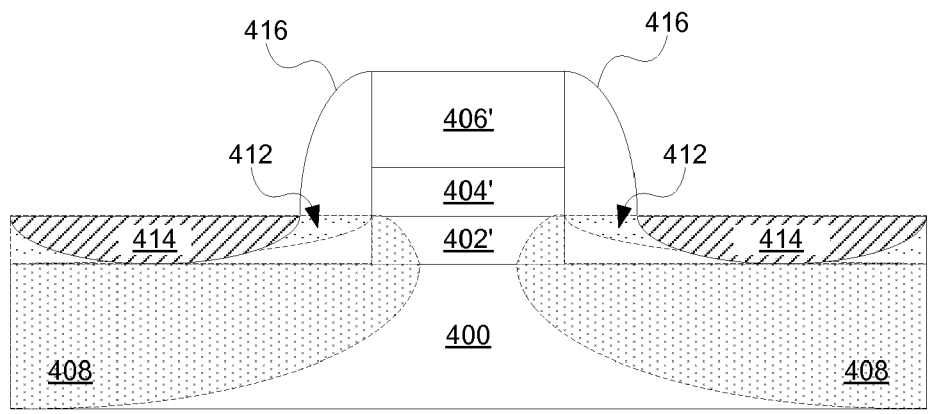
Fig._4F

US 7,545,003 B2

DEFECT-FREE SOURCE/DRAIN EXTENSIONS FOR MOSFETS HAVING GERMANIUM BASED CHANNEL REGIONS

BACKGROUND

In the manufacture of integrated circuits, high performance transistors are often built on high mobility channel regions formed of silicon germanium. One conventional process for building such transistors begins by depositing a gate stack, such as a dielectric layer and a gate electrode, on a silicon germanium layer over a silicon substrate. At least two ion implantation processes are then carried out. A first ion implantation forms lightly doped drain (LDD) implant regions that will later serve as source and drain extension regions. A second, more intense ion implantation then forms halo regions that help control short channel effects. The rest of the fabrication process builds the remaining parts of the transistor, such as spacers, source and drain regions, an inter-layer dielectric, and connections to the transistor.

It has been observed that this conventional process yields a substantial number of defects in the LDD implant regions, thereby allowing a large number of defects to be present in the source and drain extension regions of the transistor. These defects are not annealed out during the subsequent thermal budget, such as during dopant activation anneals when the source and drain regions are formed. Defects in the source and drain extension regions reduce performance of the transistor, for instance, short channel effects are worse and junction leakage is high, resulting in higher I-off levels. Accordingly, a new fabrication process is needed to reduce or eliminate such defects.

BRIEF DESCRIPTION OF THE DRAWINGS

FIGS. 1 and 2 illustrate a conventional process for forming a transistor on a high-mobility channel region.

FIG. 3 is a method of forming a transistor on a high-mobility channel region in accordance with an implementation of the invention.

FIGS. 4A through 4F illustrate structures that are formed when the method of FIG. 3 is carried out.

DETAILED DESCRIPTION

Described herein are systems and methods for reducing defects in transistor source and drain extension regions formed in germanium based channels. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention provide a fabrication process that controls short channel effects and reduces off-state current leakage in metal-oxide-semiconductor field effect transistors (MOSFETs) built on germanium or silicon germanium based channel regions integrated over a silicon substrate. More specifically, implementations of the invention use an in-situ doped epitaxial process to form high-quality source and drain extension regions (S/D extension regions) with fewer defects. By reducing the defects in the S/D extension regions, short channel effects are improved and the off-state current leakage is reduced.

By way of background, FIGS. 1 and 2 illustrate a conventional process for fabricating S/D regions for a transistor built on a silicon germanium layer. Starting with FIG. 1, a substrate 100 is shown, such as a silicon substrate, that includes a silicon germanium layer 102 formed on its surface. A gate dielectric layer 104 and a gate electrode layer 106 have been deposited and etched to form a conventional gate stack. A conventional ion implantation process is carried out to create lightly doped drain (LDD) implant regions 108 in the silicon germanium layer 102. Portions of the LDD implant regions 108 proximate to the gate dielectric layer provide the S/D extension regions.

Next, as shown in FIG. 2, a conventional angled ion implantation process is carried out to create halo regions 110 in the silicon germanium layer 102 and the substrate 100. The halo implant uses a higher energy and higher ion dosage relative to the LDD implant. The primary use of the halo regions 110 is to reduce short channel effects in the MOSFET.

Unfortunately, the conventional process shown in FIGS. 1 and 2 yields a substantial number of defects 112 in the LDD implant regions 108, thereby allowing a large number of defects to be present in the S/D extension regions of the MOSFET. It is believed that the damage to the LDD regions 108 occurs during the angled ion implantation process that produces the halo regions 110. Defects in the LDD regions 108 reduce performance of the MOSFET, for instance, short channel effects are worse. It is also believed that a large amount of current leakage occurs through these defects when the transistor is in an off-state, resulting in a high I-off value. This also causes a spread in I-off values over many transistors due to the non-uniform distribution of defects across the S/D extension regions. Furthermore, downstream annealing processes, such as the annealing process that activates the source and drain regions, are not capable of eliminating these defects. As such, the off-state current leakage and the control of short channel effects are critical issues that cannot be addressed using conventional process routes.

FIG. 3 is a process 300 of fabricating S/D regions for a MOSFET built on a germanium based channel region in accordance with an implementation of the invention. FIGS. 4A through 4F illustrate structures formed during the fabrication process of FIG. 3.

Starting with FIG. 3, the fabrication process 300 begins by providing a semiconductor substrate upon which the MOSFET can be constructed (302). The semiconductor substrate is a crystalline substrate that may be formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, or gallium antimonide. Although a few examples of materials from which the substrate may be formed are described here, any material that may serve as a foundation upon which a semiconductor device may be built falls within the spirit and scope of the present invention.

Several layers are deposited on the semiconductor substrate. The first layer is a material that may be used to form a high mobility channel region for a MOSFET, such as a silicon germanium layer (304). The silicon germanium layer may be epitaxially grown and the germanium content may range from 5% to 100%. Methods for forming a silicon germanium layer on a silicon substrate are well known in the art.

A gate dielectric layer may be formed on the silicon germanium layer (306). The gate dielectric material may be formed using any conventional material used as gate dielectrics, including but not limited to, silicon dioxide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Conventional deposition methods may be used to deposit the gate dielectric layer, including but not limited to chemical vapor deposition (CVD), atomic layer deposition (ALD), and physical vapor deposition (PVD).

A gate electrode layer may be formed on the gate dielectric layer (308). The gate electrode layer may be formed using any conventional material used as a gate electrode layer, such as polysilicon. In some implementations, a sacrificial gate material may be used that is later removed and replaced with a metal during a replacement metal gate process. Conventional deposition process may be used to deposit the gate electrode layer, including but not limited to CVD, ALD, PVD, sputtering, electroplating processes, and electroless plating processes.

FIG. 4A illustrates a semiconductor substrate 400 that has multiple layers formed on its top surface. A silicon germanium layer 402 is formed directly atop the substrate 400. A gate dielectric layer 404 is formed directly atop the silicon germanium layer 402 and has a thickness that generally ranges from 2 nm to 10 nm, although thicknesses outside of this range are possible. And a gate electrode layer 406 is formed directly atop the gate dielectric layer 404 and has a thickness that generally ranges from 2 nm to 50 nm, although thicknesses outside of this range are possible.

An etching process is then carried out to form a gate stack by removing portions of the gate electrode layer, the gate dielectric layer, and the silicon germanium layer (310). The etching process may be carried out using conventional lithography techniques, for instance, a photoresist material may be deposited and patterned to form a hardmask defining a gate stack. Multiple etching process may follow that etch the electrode, dielectric, and silicon germanium layers around the hardmask to form the gate stack. Conventional wet or dry etch chemistries may be used for these layers. In some implementations, dry etch chemistries may be chosen to maintain gate definition.

FIG. 4B illustrates a gate stack forming in accordance with an implementation of the invention. As shown, the silicon germanium layer 402, the gate dielectric layer 404, and the gate electrode layer 406 have been etched to form a gate stack that includes a silicon germanium channel region 402', a gate dielectric 404', and a gate electrode 406'. The gate stack formed here differs from a conventional gate stack because the bottom layer 402' of the gate stack of the invention is a silicon germanium channel layer, referred to herein as the "SiGe channel region", that provides high mobility for electrons and holes. The silicon germanium that is needed for the S/D extension regions and the S/D regions (i.e., the silicon germanium that is located on the substrate 400 adjacent to the SiGe channel region 402' and that becomes highly damaged during the halo ion implantation process) has been etched away at this point in the fabrication process.

Next, an angled ion implantation process is carried out to form halo regions in the SiGe channel region and the substrate 400 (312). The halo implantation is done to form halo implant regions for short channel control. The halo implantation process can use the same process parameters as a conventional halo implantation, including the same ion species, the same dosage and concentration, and the same implant energy. In some implementations, the halo implantation process may implant arsenic using a dosage of around $6 \times 10^{13}$ atoms/cm$^3$ and an implant energy around 20 kilo-electron volts (keV) to around 40 keV.

FIG. 4C illustrates the substrate 400 and the SiGe channel region 402' after the halo implantation process. As shown, halo implant regions 408 have been formed that consume a portion of the SiGe channel region 402' and a portion of the substrate 400.

After the halo implant regions are formed, an epitaxial process is used to grow a pair of silicon germanium layers on the substrate in which S/D extension regions and S/D regions may be formed (314). These silicon germanium layers are referred to herein as "epi-SiGe layers". In some implementations, during the epitaxial growth process, the epi-SiGe layers may be doped in-situ with an ion species that is appropriate for use as an LDD implant, such as $BF_2$. Other conventional LDD implants may be used as well. This enables LDD regions to be formed in the epi-SiGe layers without the need for an ion implantation process.

The epi-SiGe layers are located adjacent to the SiGe channel region. Contrary to conventional MOSFETs, the epi-SiGe layers of the invention are substantially defect-free because they have not been damaged by the angled halo implantation process. Since the halo implantation is carried out before the epi-SiGe layers are formed, the halo implant regions are not formed within the epi-SiGe layers.

In some implementations of the invention, the germanium percentage of the epi-SiGe layers may match the germanium percentage of the SiGe channel region. In other implementations, however, the in-situ doped epitaxial process may grow epi-SiGe layers having a germanium percentage that differs from the SiGe channel region. By increasing or decreasing the germanium percentage of the epi-SiGe layers relative to the SiGe channel region, a lattice structure mismatch occurs at the interfaces between the epi-SiGe layers and the SiGe channel region. This lattice mismatch induces a localized strain right at the SiGe channel region. As is known in the art, inducing this strain further increases the mobility of the channel region of the MOSFET.

In addition to inducing a strain, using a different germanium percentage in the epi-SiGe layers provides control over the injection velocity from the source region to the channel region by controlling the band off-sets. Further, this process provides good control over short channel effects and performance.

FIG. 4D illustrates a pair of epi-SiGe layers 410 that have been formed on the substrate 400. The epi-SiGe layers 410 are formed adjacent to the SiGe channel region 402'. In-situ doped LDD implant regions are not shown in FIG. 4D, but may be seen in FIG. 4E below.

Since the halo implantation is carried out before the epi-SiGe layers are formed, the halo implant regions 408 are not formed within the epi-SiGe layers 410. When the germanium percentage in the epi-SiGe layers 410 is different than the germanium percentage in the SiGe channel region 402', a lattice mismatch occurs at interfaces between the SiGe channel region 402' and each of the epi-SiGe layers 410, thereby inducing a strain in the SiGe channel region 402'.

In some implementations of the invention, the epi-SiGe layers are not doped in-situ to form LDD regions. Rather, an optional second ion implantation process may be used to form LDD implant regions in the epi-SiGe layers (316). The LDD implantation process can use the same process parameters as a conventional LDD implantation, including the same ion species (e.g., $BF_2$), the same dosage and concentration, and the same implant energy, which is generally less than 1 keV for LDD implants.

FIG. 4E illustrates the substrate 400 and the epi-SiGe layers 410 after LDD implant regions 412 have been formed that consume a portion of the epi-SiGe layers 410. Portions of the LDD implant regions 412 proximate to the gate dielectric 404' provide the S/D extension regions of the MOSFET.

A conventional process flow may now be carried out to complete fabrication of the MOSFET device (318). For instance, spacers and S/D regions may now be formed on the substrate. The spacers may be formed adjacent to the gate stack by depositing a material, such as silicon nitride or silicon dioxide, on the substrate and then etching the material to form the pair of spacers. After the spacers are formed, an ion implantation process may be used to implant dopants, such as boron, phosphorous, or arsenic, into the substrate adjacent the spacers to form S/D regions. An annealing process may follow the ion implantation process to drive the dopants further into the substrate and/or to activate the dopants. Alternately, the S/D regions may be formed by etching regions of the epitaxial silicon germanium layer and epitaxially depositing another silicon or silicon-germanium based material having a different germanium percentage.

FIG. 4F illustrates the formation of S/D regions 414 and spacers 416 on the substrate 400. Portions of the LDD implant regions 412 not consumed by the S/D regions 414 provide the S/D extension regions.

A low-k dielectric material may be deposited and polished to form an ILD layer over the device. Low-k dielectric materials that may be used for the ILD layer include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layer may include pores or other voids to further reduce its dielectric constant.

If the gate electrode is formed of a metal or polysilicon gate electrode material, the gate stack may remain as is. Alternately, if the gate electrode is formed of a sacrificial gate electrode material, a replacement metal gate process may be carried out to replace the sacrificial material with a metal gate electrode. The sacrificial gate electrode may be removed using conventional wet or dry etching processes. The metal gate electrode may be formed using any conductive material from which a metal gate electrode may be derived including pure metals, metal alloys, metal oxides, nitrides, oxynitrides, and carbides.

For instance, when the metal gate electrode will serve as an N-type workfunction metal, the gate electrode preferably has a workfunction that is between about 3.9 eV and about 4.2 eV. N-type materials that may be used to form the metal gate electrode include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the metal gate electrode will serve as a P-type workfunction metal, the gate electrode preferable has a workfunction that is between about 4.9 eV and about 5.2 eV. P-type materials that may be used to form the metal gate electrode include, but are not limited to, ruthenium, palladium, platinum, cobalt, nickel, and conductive metal oxides, e.g., ruthenium oxide.

Accordingly, a fabrication process for a MOSFET has been described that substantially reduces or eliminates damage to S/D extension regions from halo implant processes, thereby minimizing current leakage when the MOSFET is in an off-state. The methods disclosed herein enable the fabrication of a high performance MOSFET built on a high mobility silicon germanium channel region with good control over short channel effects and a low I-off. In addition, the MOSFET fabrication process of the invention enables a strain to be induced in the channel region by epitaxially depositing S/D extension regions having different germanium concentrations than the channel region, resulting in enhanced performance of the MOSFET device.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A MOSFET comprising:
    a silicon germanium channel region formed on a silicon substrate;
    a gate dielectric formed on the first silicon germanium channel region;
    a gate electrode formed on the gate dielectric;
    a pair of epi-silicon germanium layers formed on the silicon substrate adjacent to the silicon germanium channel region;
    halo implant regions formed within the silicon germanium channel region and within the silicon substrate, wherein the halo implant regions are not formed within the pair of epi-silicon germanium layers;
    LDD implant regions formed within the pair of epi-silicon germanium layers that serve as source and drain extension regions;
    a pair of spacers formed adjacent to the gate dielectric and the gate electrode; and
    source and drain regions formed within the pair of epi-silicon germanium layers.

2. The MOSFET of claim 1, wherein the gate dielectric layer comprises a material selected from the group consisting of silicon dioxide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

3. The MOSFET of claim 1, wherein the gate electrode layer comprises a material selected from the group consisting of polysilicon, a sacrificial material, hafnium, zirconium, titanium, tantalum, aluminum, metal carbide, titanium carbide, zirconium carbide, tantalum carbide, hafnium carbide, aluminum carbide, ruthenium, palladium, platinum, cobalt, nickel, a conductive metal oxide, and ruthenium oxide.

4. The MOSFET of claim 1, wherein the halo implant regions comprise As.

5. The MOSFET of claim 1, wherein the pair of epi-silicon germanium layers has a germanium percentage that is different than a germanium percentage of the silicon germanium channel region.

6. The MOSFET of claim 5, wherein the pair of epi-silicon germanium layers induce a strain on the silicon germanium channel region.

* * * * *